United States Patent [19]

Park et al.

[11] Patent Number: 5,723,384

[45] Date of Patent: Mar. 3, 1998

[54] METHOD FOR MANUFACTURING A CAPACITOR IN A SEMICONDUCTOR DEVICE USING SELECTIVE TUNGSTEN NITRIDE THIN FILM

[75] Inventors: Byung-lyul Park; Jung-min Ha, both of Seoul; Dae-hong Ko; Sang-in Lee, both of Kyungki-do, all of Rep. of Korea

[73] Assignee: Samsung Electronics Co., Ltd., Suwon, Rep. of Korea

[21] Appl. No.: 713,944

[22] Filed: Sep. 13, 1996

[30] Foreign Application Priority Data

Nov. 3, 1995 [KR] Rep. of Korea ............... 95-39660

[51] Int. Cl.⁶ ............... H01L 27/108; H01L 21/8242; H01L 27/04; H01L 21/822
[52] U.S. Cl. ............... 438/756; 438/757; 438/789; 438/689; 438/381; 438/384; 438/387

[58] Field of Search ............... 438/756, 757, 438/789, 689, 381, 384, 387

[56] References Cited

U.S. PATENT DOCUMENTS 5,330,614  7/1994  Ahn ............... 156/631

*Primary Examiner*—Susan A. Loring
*Attorney, Agent, or Firm*—Myers, Bigel, Sibley & Sajovec

[57] ABSTRACT

There is provided a method for manufacturing a capacitor in a semiconductor device including the steps of forming first and second insulating layers with a first contact hole through to a semiconductor substrate, patterning a first conductive layer to form a pedestal portion of a lower electrode, using a patterned third insulating layer selectively forming an upper portion of the lower electrode from a tungsten nitride thin film, and forming an undercut beneath the pedestal portion by wet-etching the second insulating layer.

18 Claims, 8 Drawing Sheets

5,723,384

1

METHOD FOR MANUFACTURING A CAPACITOR IN A SEMICONDUCTOR DEVICE USING SELECTIVE TUNGSTEN NITRIDE THIN FILM

BACKGROUND OF THE INVENTION

The present invention relates to a method for manufacturing a capacitor in a semiconductor device. More particularly, the present invention relates to a method for manufacturing a capacitor in a semiconductor device using a selective tungsten nitride thin film.

As devices get smaller and power supply voltages drop due to the increase in integration of semiconductor devices, it is becoming more and more difficult to obtain the same effect in terms of capacitance and reliability with conventional capacitor structures and manufacturing methods thereof. To allow the increase in integration, capacitors are scaled down, decreasing capacitance and the surface areas of electrodes. In addition, the reduction in power supply voltages accelerates the decrease in capacitor capacitance.

To circumvent the problem, a capacitor in a cylindrical structure with a large surface area and a dielectric material having a high dielectric constant such as $Ta_2O_5$ must be used. The latest conventional method for manufacturing such a cylindrically structured capacitor and dielectric film is disclosed in "Method for Manufacturing Capacitor in Semiconductor Device" of Korean patent application No. P95-003247.

FIGS. 1 through 8 are sectional views illustrating a method for manufacturing a conventional cylindrical capacitor comprised of upper and lower electrodes and a dielectric film, in a DRAM cell.

Referring to FIG. 1, first, second and third insulating layers are formed by sequentially depositing borophosphosilicate glass (BPSG), silicon nitride (SiN), and high temperature oxide (HTO) on the overall surface of a semiconductor substrate (not shown). Then, the first, second and third insulating layers are patterned by photolithography, thereby forming a first insulating layer pattern 1, a second insulating layer pattern 3, a third insulating layer pattern 5, and a contact hole 6. Thereafter, a spacer 7 is formed of a fourth insulating layer, e.g., a silicon nitride film on the sidewall of contact hole 6.

Referring to FIG. 2, a polysilicon layer 9 for forming a lower electrode of the capacitor is deposited to a thickness of 5,000 Å on the overall surface of the resultant structure while filling contact hole 6, and then, a lower photoresist layer 11, a first plasma oxide layer 13, and an upper photoresist layer 15 are sequentially coated on polysilicon layer 9.

Referring to FIG. 3, upper photoresist layer 15 is patterned by photolithography, thereby forming an upper photoresist pattern 15a which is as wide as the cylinder of the lower electrode of the capacitor to be formed.

Referring to FIG. 4, first plasma oxide layer 13 and lower photoresist layer 11 are etched, using upper photoresist pattern 15a as a mask, thereby forming a first plasma oxide layer pattern 17 and a lower photoresist pattern 19. Then, upper photoresist pattern 15a is removed and a second plasma oxide layer 21 is formed on the overall surface of the resultant structure.

Referring FIG. 5, a spacer 23 is formed by anisotropically etching second plasma oxide layer 21, during which first plasma oxide layer pattern 17 on lower photoresist pattern 19 is also removed.

2

Referring to FIG. 6, the exposed portion of polysilicon layer 9 for the capacitor lower electrode is etched to a depth of approximately 3,000 Å, using spacer 23 and lower photoresist pattern 19 as a mask, thereby forming a polysilicon pattern 9a for defining the outer circumference of the cylinder.

Referring to FIG. 7, lower photoresist pattern 19 is removed. The remaining portion of polysilicon pattern 9a outside the cylinder is etched by using spacer 23 as a mask, exposing third insulating layer pattern 5. The portion of polysilicon pattern 9a is also etched using spacer 23 to form the base of the cylinder. Thus, a cylindrical polysilicon pattern 25 is formed to be isolated from the adjacent polysilicon pattern (not shown) for the capacitor lower electrode.

Referring to FIG. 8, spacer 23 is removed by a buffered oxide etch (BOE) solvent in a subsequent process. As a way to further increase capacitor capacitance, the surface area of the lower electrode is increased with an undercut formed by partially etching third insulating layer pattern 5, e.g. HTO layer by BOE solvent to leave a portion 27 under cylindrical polysilicon pattern 25.

Thereafter, a dielectric film of the capacitor, though not shown, is formed by depositing $Ta_2O_5$ on the overall surface of the resultant structure, and then an upper electrode of the capacitor, e.g. a polysilicon layer is formed, thus, completing the capacitor.

However, in the above conventional method for manufacturing a cylindrical capacitor, the sequence of steps that must be used to complete the patterning is very complex. Especially, during formation and subsequent thermal-processing of the capacitor, oxygen diffuses from $Ta_2O_5$, and the diffused oxygen reacts with the polysilicon when polysilicon is used for the upper and lower electrodes, thereby forming oxide films at their interfaces. Further, since the oxygen diffusion produces excess Ta relative to oxygen, the $Ta_2O_5$ film becomes unstable, thereby increasing leakage current, a critical electrical characteristic that should be kept to a minimum.

SUMMARY OF THE INVENTION

The present invention provides an improved method of manufacturing a capacitor. More particularly, the present invention provides a method of manufacturing a capacitor in a semiconductor device, comprising the steps of sequentially forming a first insulating layer and a second insulating layer over a semiconductor substrate, patterning the first insulating layer and the second insulating layer to form a first contact hole exposing a portion of the semiconductor substrate, forming a first conductive layer over the second insulating layer to fill the first contact hole and electrically contact the exposed portion of the semiconductor substrate, patterning the first conductive layer to form a lower portion of a first capacitor electrode, forming a third insulating layer over the lower portion of the first capacitor electrode, patterning the third insulating layer to form a second contact hole exposing a portion of the lower portion of the first capacitor electrode, the second contact hole being surrounded by residual portions of the third insulating layer, forming an upper portion of the first capacitor electrode on the exposed portion of the lower portion of the first capacitor electrode by selectively forming a second conductive layer pattern on bottom and side wall surfaces of the second contact hole, removing the residual portions of the third insulating layer, removing the second insulating layer to form an undercut beneath the lower portion of the first capacitor electrode, forming a dielectric film over the first capacitor electrode, and forming a second electrode over the dielectric film.

According to the capacitor manufacturing method of the present invention, many steps of the conventional process can be eliminated by relying on the characteristics of the second conductive layer pattern, e.g. a selective tungsten nitride thin film, which is selectively formed only on the bottom and wall of the contact hole, not on the insulating layer pattern. Thus, the capacitor manufacturing method of the present invention has the advantage of simplicity relative to conventional methods. In particular, the stability of the $Ta_2O_5$ dielectric film is maintained since the tungsten nitride thin film serves as a diffusion barrier against the diffusion of oxygen from $Ta_2O_5$. Accordingly, the problem of leakage current encountered in conventional methods can be entirely eliminated.

BRIEF DESCRIPTION OF THE DRAWINGS

The advantages of the present invention will become more apparent upon consideration of detail preferred embodiments thereof with reference to the attached drawings in which.

DETAILED DESCRIPTION OF THE INVENTION

Figure 1:
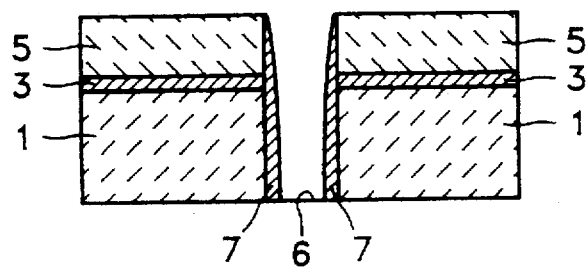
FIGS. 1 through 8 are sectional views showing a conventional method for manufacturing a capacitor in a semiconductor.
Figure 2:
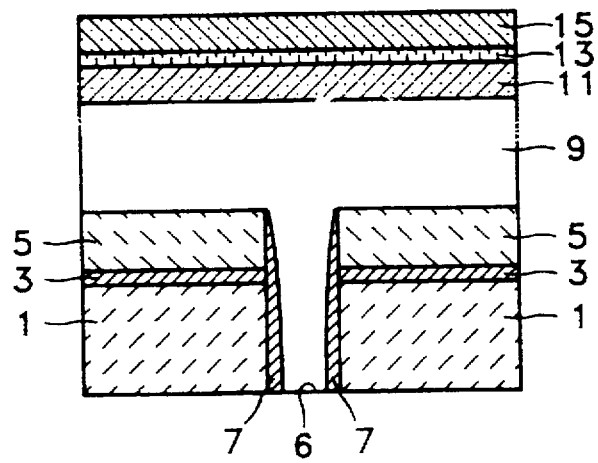
Figure 3:
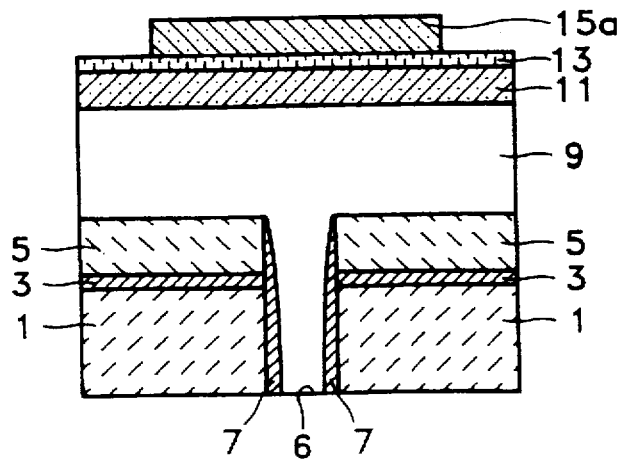
Figure 4:
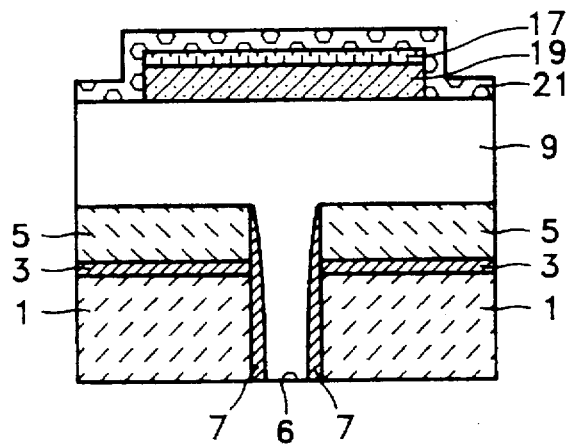
Figure 5:
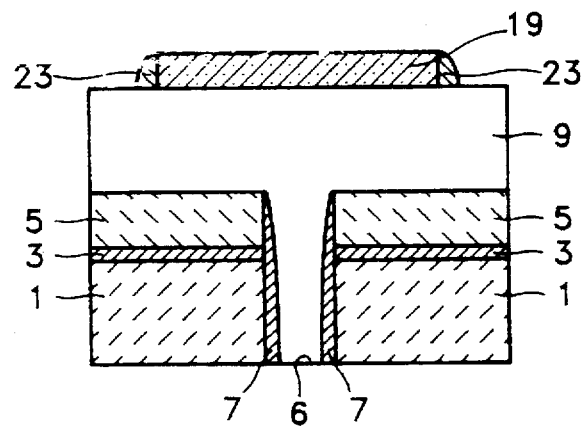
Figure 6:
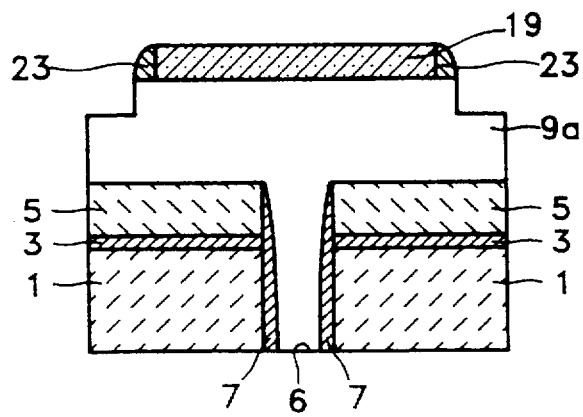
Figure 7:
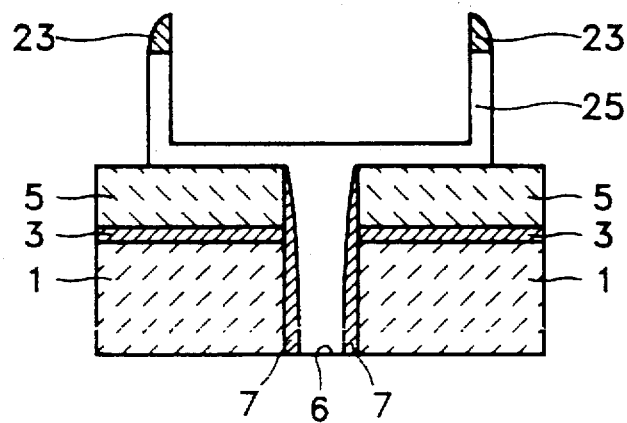
Figure 8:
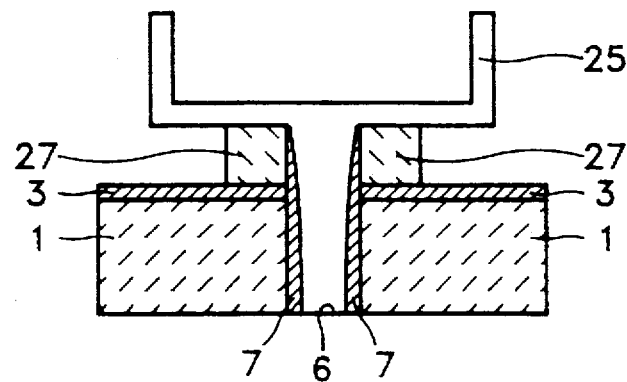
Figure 9:
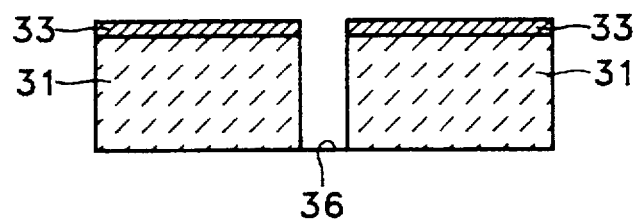
FIGS. 9 through 16 are sectional views showing a method for manufacturing a capacitor in a semiconductor, according to one embodiment of the present invention.

FIGS. 9 throught 16 are sectional views showing a method for manufacturing a capacitor in a semiconductor, according to one embodiment of the present invention.

FIG. 9 illustrates the step of forming insulating layers having a contact hole. First insulating layer and a second insulating layer are formed of a silicon oxide and a silicon nitride to be 1,200 Å and 500 Å thick, respectively, on a silicon substrate (not shown). Then, a first insulating layer pattern 31 and a second insulating layer pattern 33, and a contact hole 36 are formed by patterning the first and second insulating layers through photolithography and dry-etching.

Figure 10:
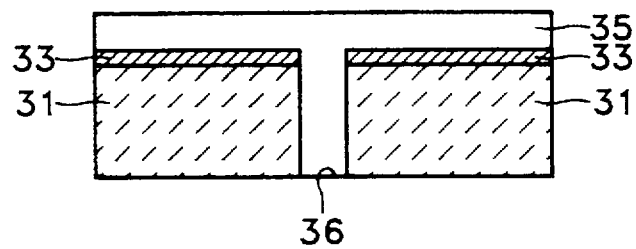

FIG. 10 illustrates the step of forming a conductive layer which will be used as portion of a lower electrode. First conductive layer 35 is formed by depositing polysilicon to a thickness of 500–5,000 Å on the overall surface of the resultant structure.

Figure 11:
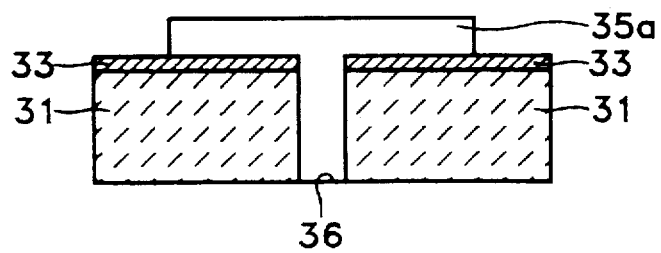

FIG. 11 illustrates the step of forming a first conductive layer pattern which will be the lower portion of the cylindrical lower electrode. First conductive layer pattern 35a is formed so that its edges from the base for the cylinder by patterning first conductive layer 35 through photolithography and etching.

Figure 12:
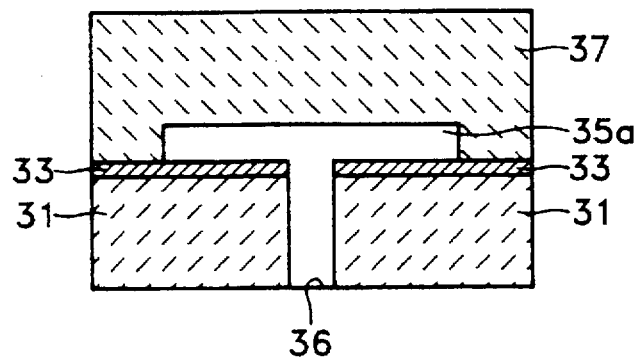

FIG. 12 illustrates the step of forming a third insulating layer. Third insulating layer 37 is formed of an oxide film to be 3,000–15,000 Å thick on the overall surface of the resultant structure.

Figure 13:
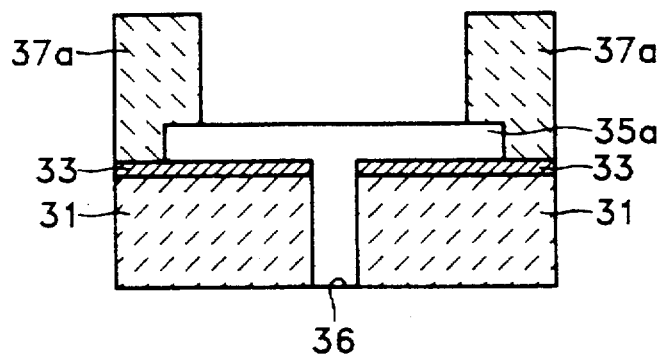

FIG. 13 illustrates the step of forming a contact hole, which will be used as a mold to form the upper portion of the cylinder on third insulating layer 37 to first conductive layer 35a. The cylindrical contact hole and third insulating layer pattern 37a are formed by patterning third insulating layer 37 through photolithography and dry-etching.

Figure 14:
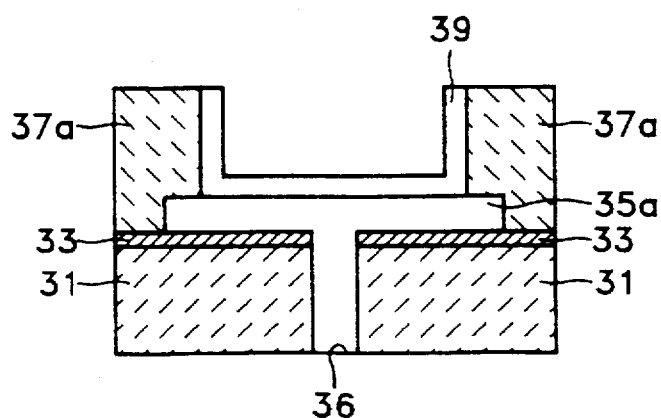

FIG. 14 illustrates the step of forming a second conductive layer pattern which will be the cylinder of the lower electrode. Second conductive layer pattern 39 is selectively formed only on the side and on the bottom of the contact hole, and not on third insulating layer pattern 37a by selectively forming a tungsten nitride thin film on first conductive layer pattern 35a exposed to the contact hole and on the wall of the contact hole. This selective tungsten nitride thin film is formed by a chemical vapor deposition (CVD) method, relying on the reaction of a deposition gas containing tungsten such as $WF_6$ or $WCL_6$, a chemical reaction agent of $H_2$, $SiH_4$, $SiHlCl_3$, $SiH_2Cl_2$, or $B_2H_6$, and either of an inorganic compound, such as $N_2$ or $NH_3$, or an organic compound of methyl-hydrizine which are injected into a reaction chamber. Preferably, the reaction chamber is at a pressure of 0.01–1 Torr and the temperature at 200°–700° C.

Figure 15:
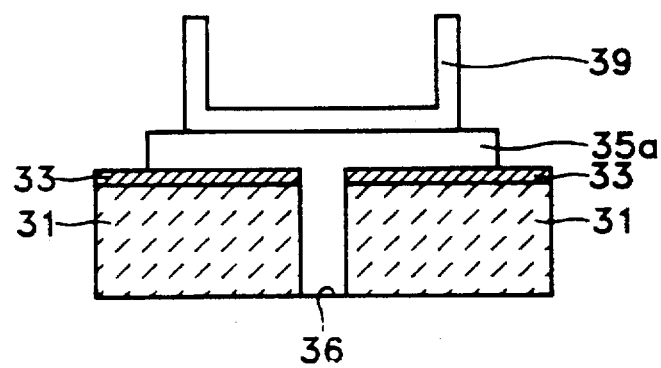

FIG. 15 illustrates the step of removing the third insulating layer pattern. Third insulating layer pattern 37a is removed by wet- or dry-etching.

Figure 16:
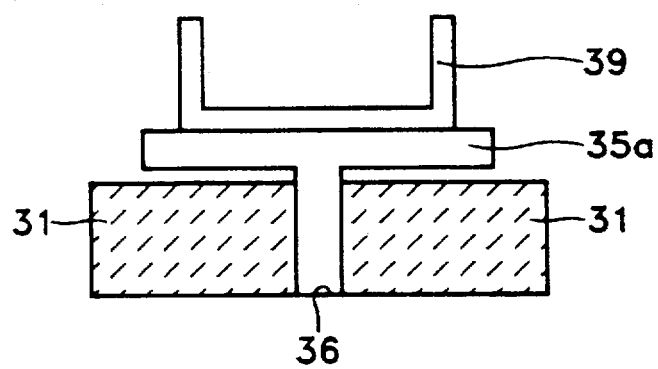

FIG. 16 illustrates the step of forming an undercut under the conductive layer pattern. The undercut is formed by wet-etching second insulating layer pattern 33 under first conductive layer pattern 35a. The formation of the undercut is for the purpose of increasing the surface area of the lower electrode, to thereby increase the capacitance of the capacitor. Thereafter, the dielectric film of the capacitor, though not shown, is formed by depositing a dielectric film having a high dielectric constant such as $Ta_2O_5$, $BaSrTiO_3$, or $SrTiO_3$, and an upper electrode is formed on the dielectric film, thus, completing the capacitor.

A second embodiment of the present invention will be described, referring to FIGS. 17 through 23.

Figure 17:
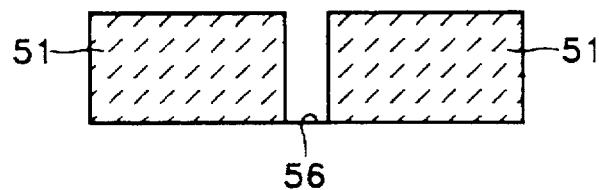
FIGS. 17 through 23 are sectional views showing a method for manufacturing a capacitor in a semiconductor, according to another embodiment of the present invention.

FIG. 17 illustrates the step of forming an insulating layer pattern having a contact hole. After a first insulating layer is formed of a silicon oxide film to a thickness of 1,200 Å on a silicon substrate (not shown), a first insulating layer pattern 51 and contact hole 56 are formed by patterning the first insulating layer through photolithography and dry-etch processing.

Figure 18:
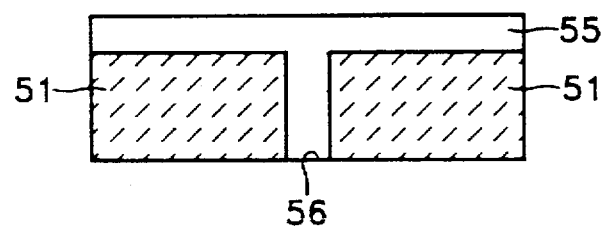

FIG. 18 illustrates the step of forming a conductive layer which will be used as a part of a lower electrode. First conductive layer 55 is formed of polysilicon to a thickness of 500–5,000 Å on the overall surface of the resultant structure, filling contact hole 56.

Figure 19:
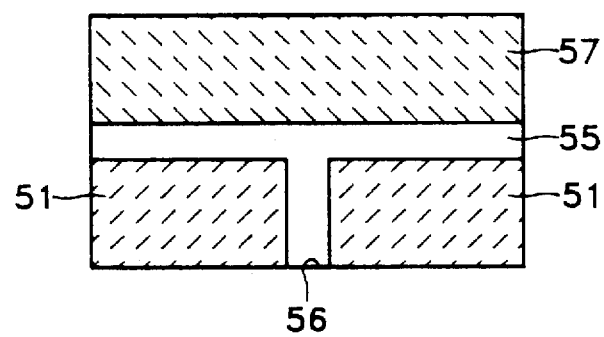

FIG. 19 illustrates the step of forming a second insulating layer. Second insulating layer 57 is formed of an oxide film to a thickness of 3,000–1,500 Å on the overall surface of the resultant structure.

Figure 20:
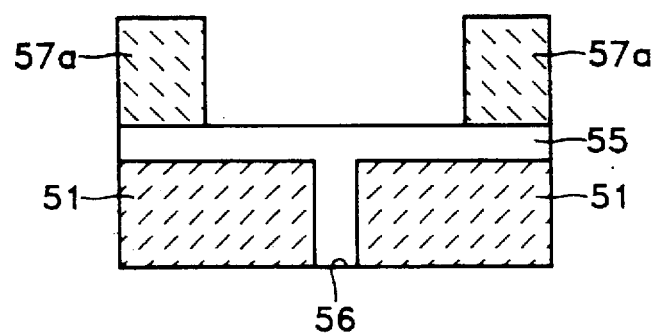

FIG. 20 illustrates the step of forming a contact hole in which a cylinder will be formed. A second insulating layer pattern 57a having a contact hole for forming the cylinder therein is formed by patterning second insulating layer 57 through photolithography and dry-etching.

Figure 21:
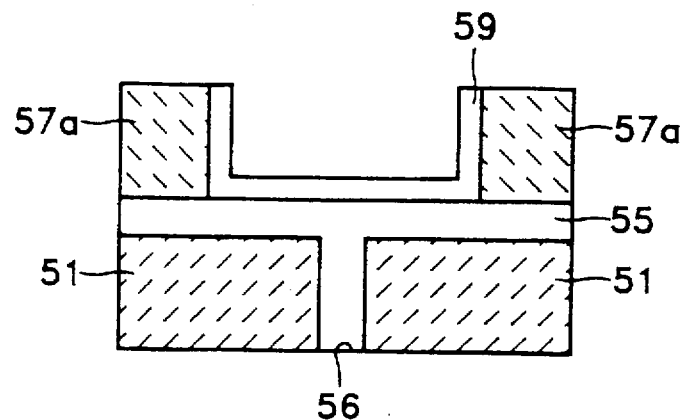

FIG. 21 illustrates the step of forming a second conductive layer pattern which will be the cylinder of the lower electrode. A second conductive layer pattern 59 is selectively formed only on the bottom and wall of the contact hole, and not on second conductive layer pattern 57a by selectively forming a tungsten nitride thin film on first conductive layer 55 exposed to the contact hole and on the wall of the contact hole. The selective tungsten nitride thin film is formed by the same method as that illustrated in FIG. 14 of the first embodiment.

Figure 22:
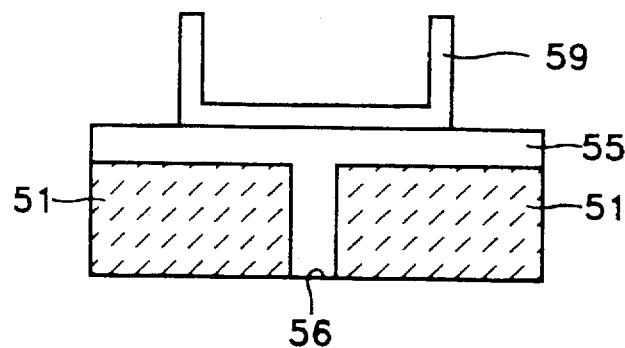

FIG. 22 illustrates the step of removing the second insulating layer pattern. Second insulating layer pattern 57a is removed by wet- or dry-etching.

Figure 23:
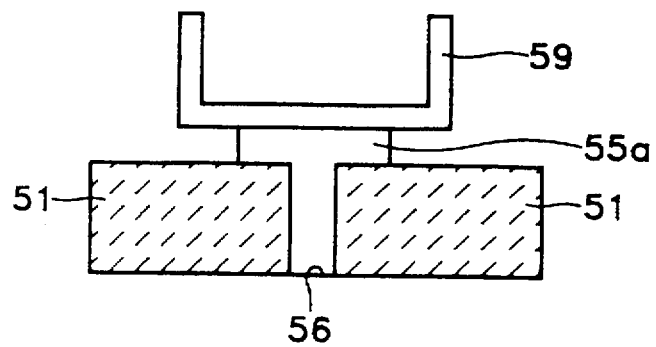

FIG. 23 illustrates the step of forming an undercut under the second conductive layer pattern. The undercut and a second conductive layer pattern 55a are formed by wet-etching first conductive layer 55, using second conductive layer pattern 59 as a mask. Thereafter, the dielectric film is formed by depositing a dielectric film having a high dielectric constant such as $Ta_2O_5$, $BaSrTiO_3$, or $SrTiO_3$. An upper electrode is formed on the dielectric film, thus, completing the capacitor.

Therefore, in the capacitor manufacturing method according to the embodiments of the present invention, many steps of process can be eliminated by relying on the characteristics of the second conductive layer pattern, e.g. a selective tungsten nitride thin film, which is selectively formed only on the bottom and wall of the contact hole, and not on the insulating layer pattern. Thus, the capacitor manufacturing method of the present invention has the advantage of manufacturing process simplicity relative to conventional methods.

In this capacitor manufacturing method, the tungsten nitride thin film serves as a diffusion barrier against the diffusion of oxygen from the dielectric film, e.g. a $Ta_2O_5$ film and thus the stability of the $Ta_2O_5$ film can be maintained. Accordingly, the problem of leakage current encountered in the conventional method can be entirely eliminated.

The present invention is not restricted to the above embodiments, and it is clearly understood that many variations are possible within the scope and spirit of the present invention by anyone skilled in the art.

What is claimed is:

1. A method of manufacturing a capacitor in a semiconductor device, comprising the steps of;
   sequentially forming a first insulating layer and a second insulating layer over a semiconductor substrate;
   patterning the first insulating layer and the second insulating layer to form a first contact hole exposing a portion of the semiconductor substrate;
   forming a first conductive layer over the second insulating layer to fill the first contact hole and electrically contact the exposed portion of the semiconductor substrate;
   patterning the first conductive layer to form a lower portion of a first capacitor electrode;
   forming a third insulating layer over the lower portion of the first capacitor electrode;
   patterning the third insulating layer to form a second contact hole exposing a portion of the lower portion of the first capacitor electrode, the second contact hole being surrounded by residual portions of the third insulating layer;
   forming an upper portion of the first capacitor electrode on the exposed portion of the lower portion of the first capacitor electrode by selectively forming a second conductive layer pattern on bottom and side wall surfaces of the second contact hole;
   removing the residual portions of the third insulating layer;
   removing the second insulating layer to form an undercut beneath the lower portion of the first capacitor electrode;
   forming a dielectric film over the first capacitor electrode; and,
   forming a second electrode over the dielectric film.

2. The method of claim 1, wherein the step of removing the second insulating layer to form an undercut beneath the lower portion of the first capacitor electrode comprises a wet-etching process step.

3. The method of claim 1, wherein the step of removing the second insulating layer to form an undercut beneath the lower portion of the first capacitor electrode comprises a dry-etching process step.

4. The method of claim 1, wherein the first insulating layer is formed of silicon oxide, and the second insulating layer is formed of silicon nitride.

5. The method of claim 1, wherein the first conductive layer pattern is formed of polysilicon, and the second conductive layer pattern is formed from a tungsten nitride thin film.

6. The method of claim 5, wherein the step of forming an upper portion of the first capacitor electrode on the exposed portion of the lower portion of the first capacitor electrode by selectively forming the tungsten nitride thin film on the bottom and side wall surfaces of the second contact hole comprises the step of:
   forming by chemical vapor deposition the tungsten nitride thin film relying on a reaction between a deposition gas containing tungsten, a chemical reaction agent, and an inorganic compound.

7. The method of claim 5, wherein the step of forming an upper portion of the first capacitor electrode on the exposed portion of the lower portion of the first capacitor electrode by selectively forming the tungsten nitride thin film on the bottom and side wall surfaces of the second contact hole comprises the step of:
   forming by chemical vapor deposition the tungsten nitride thin film relying on a reaction between a deposition gas containing tungsten, a chemical reaction agent, and an organic compound.

8. The method of 6, wherein the deposition gas is one selected from a group consisting of $WF_6$ and $WCl_6$.

9. The method of 7, wherein the deposition gas is one selected from a group consisting of $WF_6$ and $WCl_6$.

10. The method of claim 8, wherein the inorganic compound is one selected from a group consisting of gaseous $N_2$ and $NH_3$.

11. The method of claim 9, wherein the organic compound is methyl-hydrizine.

12. The method claim 6, wherein the chemical reaction agent is one selected from a group consisting of $H_2$, $SiH_4$, $SiHlCl_3$, $SiH_2Cl_2$, and $B_2H_6$.

13. The method claim 7, wherein the chemical reaction agent is one selected from a group consisting of $H_2$, $SiH_4$, $SiHlCl_3$, $SiH_2Cl_2$, and $B_2H_6$.

14. The method of claim 1, wherein the dielectric film is formed of one selected from a group consisting of $Ta_2O_5$, $BaSrTiO_3$, and $SrTiO_3$.

15. A method for manufacturing a capacitor, comprising the steps of:
   forming a first insulating layer over a semiconductor substrate;
   patterning the first insulating layer to form a first contact hole exposing a portion of the semiconductor substrate;
   forming a first conductive layer over the first insulating layer to fill the first contact hole;
   forming a second insulating layer over the first conductive layer;
   patterning the second insulating layer to form a second contact hole exposing a portion of the first conductive layer, the second contact hole being surrounded by residual portions of the second insulating layer;

selectively forming a second conductive layer pattern on bottom and side wall surfaces of the second contact hole;

removing the residual portions of the second insulating layer;

forming an undercut beneath the second conductive layer pattern by wet-etching the first conductive layer using the second conductive layer pattern as a mask, the combination of the second conductive layer pattern and wet-etched first conductive layer forming a first capacitor electrode;

forming a dielectric film over the first capacitor electrode; and, forming a second capacitor electrode on the dielectric film.

16. The method of claim 15, wherein the second conductive layer pattern is formed of a tungsten nitride thin film.

17. The method of claim 16, wherein the step of selectively forming the tungsten nitride thin film on bottom and side wall surfaces of the second contact hole comprises the step of:

forming by chemical vapor deposition the tungsten nitride thin film relying on a reaction between a deposition gas containing tungsten, a chemical reaction agent, and an inorganic compound.

18. The method of claim 16, wherein the step of selectively forming the tungsten nitride thin film on bottom and side wall surfaces of the second contact hole comprises the step of:

forming by chemical vapor deposition the tungsten nitride thin film relying on a reaction between a deposition gas containing tungsten, a chemical reaction agent, and an organic compound.

* * * * *